(12) United States Patent
Gebara et al.

(10) Patent No.: US 7,394,276 B2
(45) Date of Patent: Jul. 1, 2008

(54) ACTIVE CANCELLATION MATRIX FOR PROCESS PARAMETER MEASUREMENTS

(75) Inventors: Fadi H. Gebara, Austin, TX (US); Ying Liu, Austin, TX (US); Jayakumaran Sivagnaname, Austin, TX (US); Ivan Vo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 11/333,612

(22) Filed: Jan. 17, 2006

(65) Prior Publication Data

US 2007/0164769 A1 Jul. 19, 2007

(51) Int. Cl.
*G01R 31/26* (2006.01)
(52) U.S. Cl. ..................... 324/765; 324/769
(58) Field of Classification Search ......... 324/760–765, 324/770, 158.1, 130–133; 349/142–152; 257/48
See application file for complete search history.

(56) References Cited

U.S. PATENT DOCUMENTS

| | | | |
|---|---|---|---|
| 3,818,274 A | 6/1974 | DeWitte et al. | |
| 4,169,243 A | 9/1979 | Payne et al. | |
| 4,819,038 A * | 4/1989 | Alt | 257/10 |
| 5,919,269 A * | 7/1999 | Ong | 714/721 |
| 5,977,757 A | 11/1999 | Felps | |
| 5,999,002 A | 12/1999 | Fasnacht et al. | |
| 6,630,840 B2 * | 10/2003 | Tomita | 324/765 |
| 6,856,161 B2 * | 2/2005 | Thewes | 324/769 |

\* cited by examiner

*Primary Examiner*—Vinh P Nguyen
(74) *Attorney, Agent, or Firm*—Casimer K. Salys; Jack V. Musgrove

(57) ABSTRACT

An active cancellation matrix for process parameter measurements provides feedback paths for each test location wherein each feedback path is used to sense the applied voltage and the sensed voltage is used to adjust the source voltage for any variations along the input path. The devices under test are arranged in a row and column array, and the feedback and voltage input paths are formed along respective rails which extend generally parallel to a row of devices under test. Selectors are used to selectively route the outputs of the test nodes to a measurement unit such as a current sensor. The input voltages can be varied to establish current-voltage (I-V) curves for the devices under various conditions. In the example where the devices under test are transistors, each source input includes three voltage inputs (rails) for a drain voltage, a source voltage, and a gate voltage.

6 Claims, 3 Drawing Sheets

ACTIVE CANCELLATION MATRIX FOR PROCESS PARAMETER MEASUREMENTS

This invention was made with Government support under DARPA, NBCH3039004. THE GOVERNMENT HAS CERTAIN RIGHTS IN THIS INVENTION.

BACKGROUND OF THE INVENTION

1 Field of the Invention

The present invention generally relates to the design and testing of integrated circuits, and more particularly to a method and system for testing an array of electronic devices.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern one or more dies on a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Faster performance and predictability of responses are elements of interest in circuit designs. As process technology scales to the deep-submicron (DSM) regime, it is becoming increasingly important for the performance and reliability of IC chips and systems to understand how variations in process parameters affect the operation of an electronic device or circuit. A designer needs to model responses such as current flow with changes in voltage for transistors (I-V curves), or resistance/capacitance measurements for wiring. Device testing may further include leakage measurements across a gate, to indirectly assess the quality of an oxide material and identify potential flaws like pin holes or edge defects. Some devices such as static random-access memory (SRAM) require testing the memory elements with random fluctuations in threshold voltages to better characterize the circuit. Devices should also be stress tested, i.e., under different conditions such as varying temperatures. It is also useful to understand how spatial variations (i.e., devices located in different dies on a single wafer) can affect process parameters.

One example of a circuit used for such testing of an array of devices is shown in FIG. 1. The devices under test (DUTs) in circuit 2 are transistors, three of which 4, 6, 8 are shown arranged in a row. Circuit 1 can be replicated for other rows which together form an array of DUTs. Each DUT receives three voltage signals, a drain voltage $V_D$, a gate voltage $V_G$, and a source voltage $V_S$. These voltage signals are fed by three respective operational amplifiers 10, 12, 14. The amplitude of the voltage signals may be selectively controlled using respective digital-to-analog converters (DACs) 16, 18, 20 each of which has an N-bit control input. The terminal end of the voltage supply rail 22 is connected to measurement circuitry, e.g., current sensors. Current output for each pin set in the row is monitored as the voltages are varied to establish I-V curves for the devices.

While the outputs of circuit 2 provide a fair basis to characterize the response of the devices, the measurements are not completely accurate since they fail to take into consideration loading effects on signal transmission. Even metal wires have a very small resistance, represented in FIG. 1 as resistor symbols along sections of the transmission lines. This resistance (as well as capacitance) affects the propagation of signals in the wires. These loading effects can vary with wire length and environmental parameters such as temperature. In order to have a truly precise measurement, it is necessary to know the exact value of the test parameter applied to the device (e.g., voltage). While the loading effects can be estimated based on theoretical values or manufacturing specifications, physical analysis of resistance effects for different wiring indicates that the actual values within a cell can vary considerably from an expected norm. Calibration of the measurement circuitry does not compensate for variations in the loading effects.

There are many circuit designs adapted to sense or supply an exact voltage in a circuit. U.S. Pat. No. 3,818,274 describes a remote sensing voltage clamping circuit, that clamps a power source output level to prevent overvoltage levels at a remote load. That design uses a high impedance sensing lead and a detector-clamping circuit coupled intermediate the sending lead and the power source. U.S. Pat. No. 4,169,243 discloses a remote sensing apparatus used with a measurement device such as a strain gauge. The apparatus uses two operational amplifiers to cancel errors in the output voltage due to voltage drops in three lead wires. U.S. Pat. No. 5,977, 757 teaches a power supply having automatic voltage sensing. The power supply generates a regulated voltage in response to an input voltage and an error signal, and the error signal is generated by a sensing circuit having a high input impedance differential amplifier with inputs coupled to voltage sense terminals. U.S. Pat. No. 5,999,002 shows a contact resistance check circuit that verifies when a sufficient electrical connection is established between a source and a sense lead of a Kelvin connection. An input pulse to the sense probe is altered in related to the contact resistance to produce a check pulse. A comparator generates a fault indication signal if the voltage of a check pulse exceeds a threshold voltage.

These sensing techniques basically apply a voltage and sense the actual voltage with a high impedance node. They all use discrete components, that is, separate circuit structures, which facilitates remote sensing, but there are problems with applying these techniques to testing of electronic devices. Because of their discrete nature, it is difficult to implement these designs in a single integrated circuit. Also, none of these techniques can be rasterized, i.e., applied to an array of columns and rows of devices. It is useful to be able to have an array structure for testing to measure spatial variations in devices/circuits.

In light of the foregoing, it would be desirable to devise an improved method of applying a known voltage to a testing device/circuit which takes loading effects into consideration. It would be further advantageous if the method could be implemented in a geometric matrix (row/column array) of devices/circuits under test.

SUMMARY OF THE INVENTION

It is therefore one object of the present invention to provide an improved method of testing electronic devices in an integrated circuit.

It is another object of the present invention to provide such a method that takes into consideration loading effects of transmission wires in the testing circuitry.

It is yet another object of the present invention to provide such a method which can easily be applied to a row and column structure of devices under test.

The foregoing objects are achieved in an active cancellation matrix for an array of devices under test, generally comprising a plurality of source inputs for generating voltage signals, a plurality of voltage rails wherein each of said voltage rails connects a respective one of said source inputs to a plurality of test nodes arranged in a row with first wire sections formed by taps along the voltage rail to the test nodes and each first wire section having a respective transmission load, and a plurality of feedback rails wherein each of said feedback rails connects a feedback input of a respective one of the source inputs to the test nodes in the row with second wire sections formed by taps along the feedback rail to the test nodes and each second wire section used to sense a voltage applied at the node and adjust the voltage signal for any variations in the first transmission load of a corresponding first wire section. The voltage and feedback rails of a row input are generally parallel to a direction of a row of test nodes, and the voltage and feedback rails of a column input are generally parallel to a direction of a column of test nodes. A digital-to-analog converter may be used to vary the amplitude of the voltage signals, and the current can be measured for the varying input voltages to establish I-V curves for the devices. One or more selectors are used to route outputs of the test nodes to the measurement unit. In the example where the devices under test are transistors, each source input can includes three voltage inputs for a drain voltage, a source voltage, and a gate voltage.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
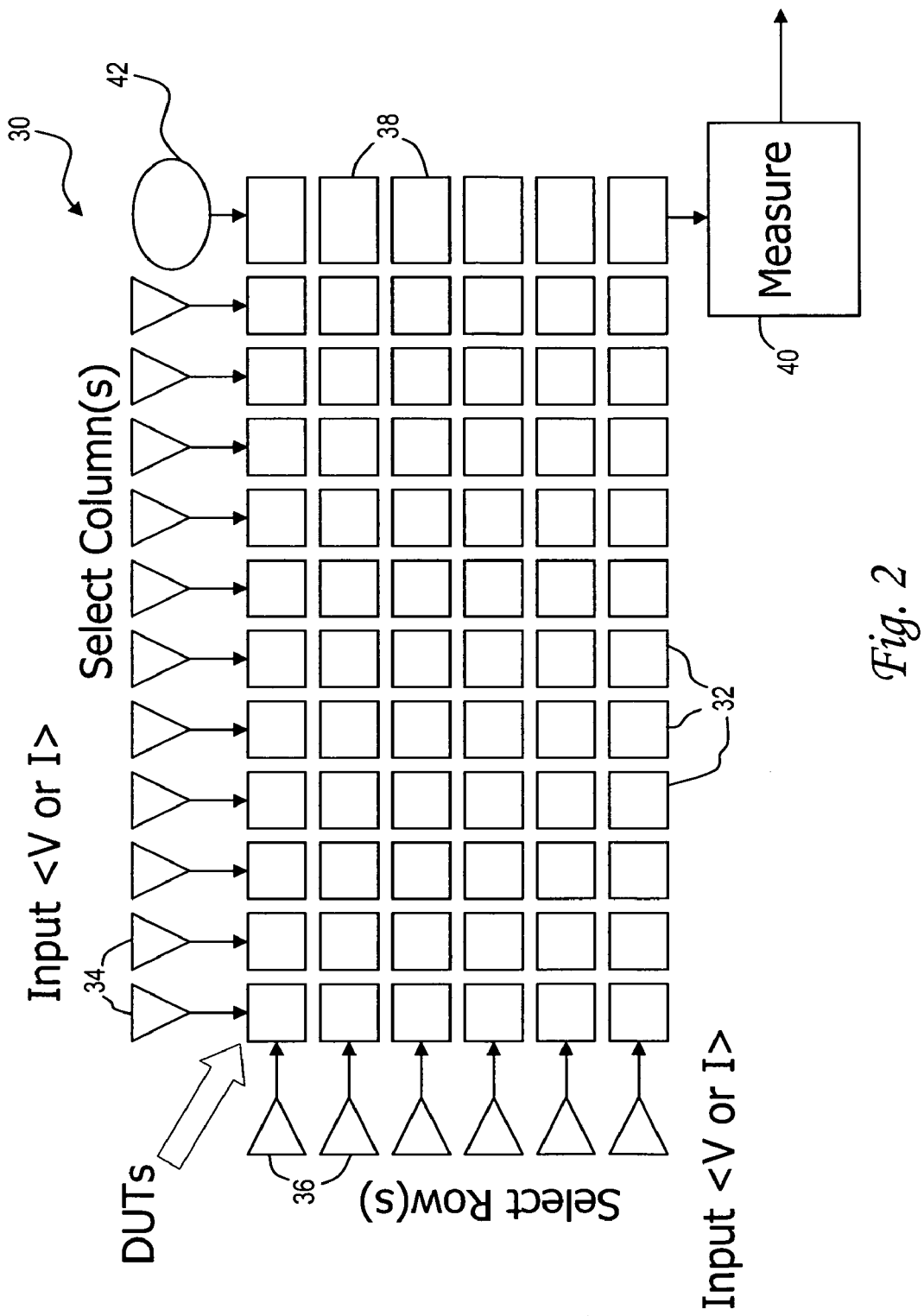
FIG. 2 is a block diagram of a test system constructed in accordance with one embodiment of the present invention, having an active cancellation matrix which compensates for variations in transmission line loading effects.

With reference now to the figures, and in particular with reference to FIG. 2, there is depicted one embodiment 30 of a test system constructed in accordance with the present invention. Test system 30 may be formed as part of a single integrated circuit (IC) test chip having various types of electronic devices to be tested, and is generally comprised of a plurality of devices under test (DUTs) 32, a plurality of column inputs 34, a plurality of row inputs 36, a plurality of selectors 38, a measurement unit 40, and selector control logic 42. DUTs 32 are arranged in a matrix or array having rows and columns. In this example there are six rows and eleven columns. DUTs 32 can be single elements such as a transistor, or more complicated circuit structures. DUTs 32 can also be as simple as sections of interconnects with vias and contacts.

The input signals may be any parameter of interest, such as voltage or current. For example, when the DUTs are transistors, test system 30 can provide varying input voltages and measure the current response. Selected voltage levels are injected at the desired DUT node through column and row inputs 34, 36, and the outputs of the transistors are routed through the appropriate selectors 38 to measurement unit 40. The output of measurement unit 40 is connected to a recording unit or a user interface device such as a video display. I-V curves for the DUTs can be established by monitoring current responses for varying voltage inputs. The output of measurement unit 40 may represent an output of a single DUT, or a composite output based on multiple DUTs whose outputs are combined by selectors 38. The multiplexers in selectors 38 are set by control logic 42 which is further responsive to a user interface device such as a console.

The construction of test system 30 includes an active cancellation matrix for process parameter measurements which uses differential amplifiers to accurately supply DUT voltages by effectively nullifying loading effects. One implementation for the active cancellation matrix includes a test circuit 50 illustrated in FIG. 3. Test circuit 50 includes three DUTs (transistors) 32a, 32b, 32c in one row of the matrix, and other identical test circuits are added for other rows to complete the matrix. Each DUT receives three voltage signals, a drain voltage $V_D$, a gate voltage $V_G$, and a source voltage $V_S$. These voltage signals are fed by three respective differential amplifiers 58, 60, 62. The amplitude of the voltage signals may be selectively controlled using respective digital-to-analog converters (DACs) 64, 66, 68 each of which has an N-bit control input. N is number of input bits that control the voltage output of the DAC (e.g., 3-8 bits). Any number of known voltages can be applied using this technique. The terminal end of the voltage supply rail 70 is connected to a respective input of one of the selectors 38. One of the voltage inputs, e.g., input $V_D$, may be a column input 34 while another of the voltage inputs, e.g., $V_G$, may be a row input 36. The voltage rails for the column inputs are vertically disposed and the voltage rails for the row inputs are horizontally disposed, i.e., the row inputs are generally orthogonal to the column inputs.

Figure 3:
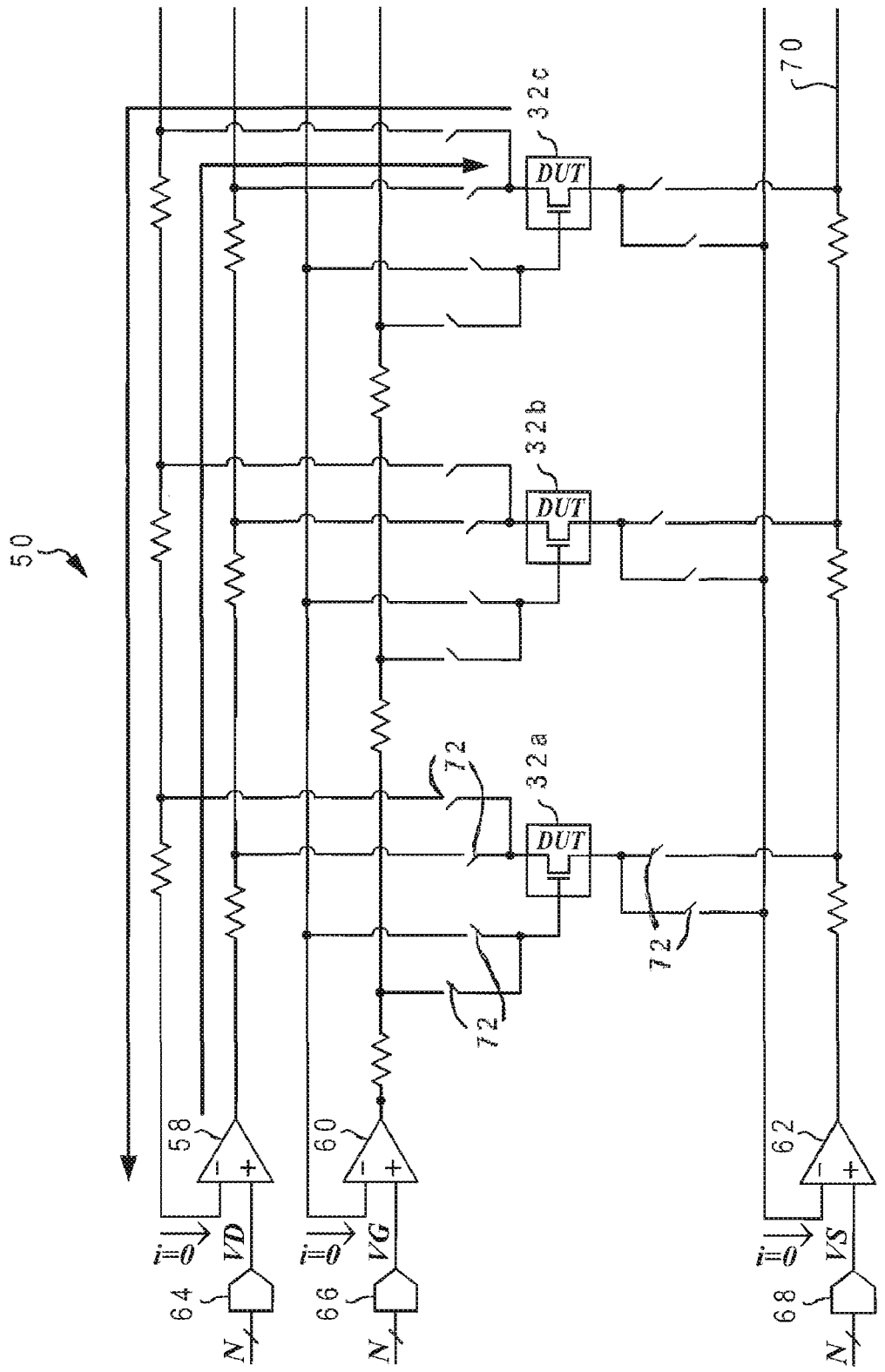
FIG. 3 is a schematic diagram of one embodiment of a test circuit for the active cancellation matrix used by the test system of FIG. 2.

In order to compensate for variations in loading effects on the applied voltage, a feedback path is provided from each DUT back to the respective input source wherein the feedback path is used to sense the applied voltage and vary the source voltage accordingly. The feedback path for each input source include sections of wire along another voltage rail extending generally parallel to the length of the DUT row, which is connected to the negative input of the respective differential amplifier, with taps to this rail at each DUT along the common row. For example, two arrows are shown in FIG. 3 representing the input voltage path from differential amplifier 58 to DUT 32c and the feedback path from DUT 32c to differential amplifier 58.

Figure 1:
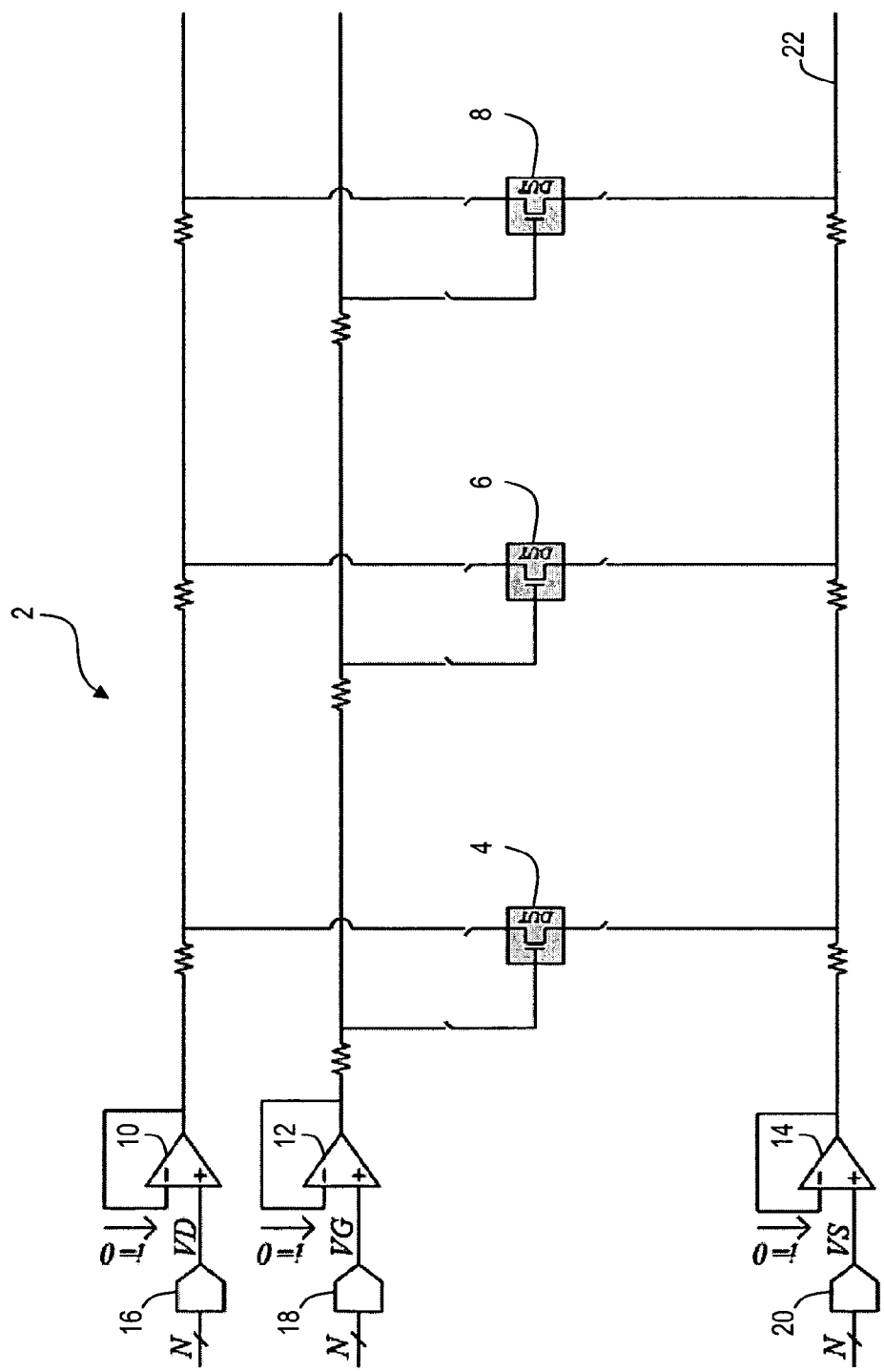
FIG. 1 is a schematic diagram of a conventional test circuit showing three devices under test (transistors) arranged in a row.

In FIG. 1 the feedback path to an amplifier does not have much resistance associated with it, since the output of the amplifier is directly fed to the input. However, the feedback paths in FIG. 3 include large resistances. In an operational amplifier, the input node is a high impedance node and hence current flowing into the input is approximately zero. In the context of circuit 50, if there were any current flowing through the feedback path, it would cause a voltage drop across the feedback path, and the voltage sensed at the drain node of DUT 32a would be larger than the voltage seen at the negative terminal of op amp 58. The lack of current flowing through the feedback path (I=0) ensures that the voltage seen at the negative terminal of op amp 58 is the exact voltage seen at the drain of DUT 32a.

All of the input voltage paths and feedback paths may be selectively opened or closed using switches. The switches are controlled by the same select logic that controls the row and column select lines, i.e., the six switches 72 shown for a given DUT all close when the row select signal for that DUT is active and the column select signal for that DUT is active.

The present invention may thus advantageously apply a known, precise voltage at any point in an array of devices to be tested. There is no need to calibrate the system for a given process parameter since the applied voltages are automatically adjusted by the required resistance values, and minimum size wires can be used without regard to resistance. Wire resistance can also be measured as a side benefit of this technique, by measuring the output voltage of the op amp. The resistance associated with the wire is calculated according to ohm's law, e.g., the resistance of the path from the output of op amp 58 to the drain node of the DUT 32a is equal to the difference between the voltage measured at the output of op amp 58 and $V_D$, divided by the current measured at rail 70.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of applying a known voltage at a test location in an array of devices under test arranged in rows and columns, comprising:
   selectively injecting at least one voltage signal from one of a plurality of row and column source inputs to a respective one of the devices under test in the array using a first wire; and
   selectively providing a feedback path from the device under test to the source input using a second wire to sense the applied voltage and adjust the voltage signal for any variations in the first wire, wherein the voltage signal is selectively injected and the feedback path is selectively provided using switches to close a circuit which includes the first and second wires, and the switches are controlled by select logic that also controls the selection of the row and column source inputs.

2. The method of claim 1 wherein:
   the first wire is a section of a first rail that extends generally parallel to a direction of a row of the devices under test; and
   the second wire is a section of a second rail that extends generally parallel to the first wire.

3. The method of claim 1 wherein the voltage signal is a first voltage signal, and further comprising repeating the injecting and providing steps with a second voltage signal whose amplitude is different from the first voltage signal.

4. The method of claim 1, further comprising:
   selectively routing at least one output of the device under test to a measurement unit; and
   measuring a current of the output using the measurement unit.

5. The method of claim 1 wherein the devices under test are all transistors.

6. The method of claim 5 wherein said injecting step includes:
   selectively injecting a drain voltage signal to a drain of a transistor under test;
   selectively injecting a gate voltage signal to a gate of the transistor under test; and
   selectively injecting a source voltage signal to a source of the transistor under test, wherein the at least one voltage signal is one of the drain voltage signal, the gate voltage signal, and the source voltage signal.

* * * * *